United States Patent [19]

Wright

[11] 4,075,569
[45] Feb. 21, 1978

[54] DIGITAL METHOD AND APPARATUS FOR DYNAMICALLY GENERATING AN OUTPUT PULSE TRAIN HAVING A DESIRED DUTY CYCLE FROM AN INPUT PULSE TRAIN

[75] Inventor: Howard O. Wright, Irvine, Calif.

[73] Assignee: Rockwell International Corporation, El Segundo, Calif.

[21] Appl. No.: 727,071

[22] Filed: Sept. 27, 1976

[51] Int. Cl.$^2$ .............................................. H03K 5/04
[52] U.S. Cl. ................................. 328/58; 179/16 EC; 307/265; 328/164
[58] Field of Search ................. 307/234, 265; 328/111, 328/112, 58, 164; 179/16 E, 16 EA, 16 EC

[56] References Cited

U.S. PATENT DOCUMENTS

| | | | |
|---|---|---|---|
| 3,452,220 | 6/1969 | Fritschi | 307/265 |
| 3,504,290 | 3/1970 | Earle | 328/164 |
| 3,671,875 | 6/1972 | Pento | 307/234 |
| 3,700,821 | 10/1972 | Savage | 179/16 E |
| 3,766,323 | 10/1973 | Wittman | 179/16 EA |
| 3,805,167 | 4/1974 | Nash et al. | 307/265 |

Primary Examiner—Stanley D. Miller, Jr.
Attorney, Agent, or Firm—Howard R. Greenberg; H. Fredrick Hamann

[57] ABSTRACT

The pulses of an output pulse train are made to conform to a desired duty cycle within the limits afforded by the individual cyclical periods of an input pulse train by digitally measuring each input cyclical period to afford a digital counting interval indicative thereof and providing during the next successive cyclical period a traversal of the digital counting interval in a time corresponding to a predetermined percentage (desired duty cycle) of the measured period. Each output pulse is initiated after the transpiration of a predetermined period of time from the onset of each input pulse and terminated upon the earlier completion of the cyclical period for that input pulse or the digital counting interval initiated during that period.

10 Claims, 3 Drawing Figures

DIGITAL METHOD AND APPARATUS FOR DYNAMICALLY GENERATING AN OUTPUT PULSE TRAIN HAVING A DESIRED DUTY CYCLE FROM AN INPUT PULSE TRAIN

BACKGROUND OF THE INVENTION

The present invention pertains generally to digital electronics and specifically to a digital technique for dynamically modifying the individual pulses of a pulse train to conform to a predetermined duty cycle.

To assure the faithful transmission and reception of dial pulses used in telephone systems for identifying a called telephone number, stringent requirements are placed on the pulse train parameters. for example, the pulse rate is normally designed to lie within a range of 8-12 pulses per second (with each pulse representing a decimal value 1 and the number of pulses in a single pulse train representing the decimal numerical value for a particular digit of the called number) with a duty cycle of about 60% for each pulse. To meet these requirements in long distance calling, where the vagaries of the transmission medium may severely distort the dial pulses, it is common practice at tandem switching and repeater points to appropriately modify the received input pulse train before retransmitting it, particularly so as to meet the duty cycle requirement. Although there are many analog and semi-analog techniques such as disclosed in U.S. Pat. No. 3,637,943, entitled "Telephone Signaling Unit" for accomplishing this, the prior art does not teach any wholly digital implementation which capitalizes on the many well recognized benefits realized from a totally digitalized design. In this connection, it should be pointed out that although digital designs are eminently compatible with information storage and retrieval, the telephone system application herein requires a dynamic design wherein the modified output desired pulses are generated and transmitted as their counterpart input pulses are received. Thus, standard and wellknown digital storage techniques do not appertain.

With the foregoing in mind, it is a primary object of the present invention to provide a new and improved technique for dynamically generating an output pulse train from an input pulse train which conforms to a predetermined duty cycle within the cyclical period constraints of the input pulse train.

It is a further object of the present invention to provide such a new and improved technique which strictly employs digital elements.

It is still a further object of the present invention to provide such a technique which is well adapted for telephone system utilization.

The foregoing objects as well as others and the means by which they are achieved through the present invention may best be appreciated by referring to the Detailed Description of the Preferred Embodiment which follows hereinafter together with the appended drawings.

BRIEF DESCRIPTION OF THE INVENTION

In accordance with the stated objects, each cyclical period of an input pulse train, beginning with the leading edge of a pulse and terminating with the leading edge of the next successive pulse, is digitally measured to afford a digital counting interval which is a measure thereof, and which is traversed during the next successive cyclical period in a time corresponding to a predetermined percentage of the measured cyclical period, or in other words, the desired duty cycle. Each output pulse, which occurs within a given input cyclical period, thus has a duty cycle which is determined by the immediately preceding input cyclical period. The digital counting interval is inititated upon the transpiration of a predetermined period of time following the onset of each input pulse, coincident with the initiation of the counterpart output pulse, which ensures that only input pulses exceeding a predetermined width are in fact regenerated. The output pulse is terminated upon the earlier completion of either the input cyclical period during which it is initiated or the digital counting interval, thus assuring that no output pulse extends into the cyclical period for the next input pulse. Logic circuitry is additionally provided for assuring that an output pulse is generated only in response to a valid input pulse by inhibiting the termination of an output pulse prior to the termination of the input pulse to which it corresponds. Since there can be no cyclical period for determining the digital counting interval to employ in connection with the first input pulse, means are provided for generating a first output pulse having a predetermined duration which is designed to avoid any extension over into the cyclical period for the second input pulse.

In the preferred embodiment, the aforementioned digital counting interval is provided through the use of two digital counters, one counter for establishing a digital count representative of the measured cyclical period which is then loaded into the second counter prior to its activation and which is clocked at a frequency vis-a-vis the first counter so that it traverses the digital counting interval at a faster rate corresponding to the desired duty cycle. The telephone application for the invention as described in the preferred embodiment employs a 58% duty cycle which is specifically provided by operating both counters from the same clock pulses, but whose frequency is halved before being applied to the first counter and wherein one out of every seven consecutive clock pulses is dropped through the use of a three-stage maxi-length counter being applied to the second counter.

DETAILED DESCRIPTION OF THE PREFERRED EMBODIMENT

Figure 1:
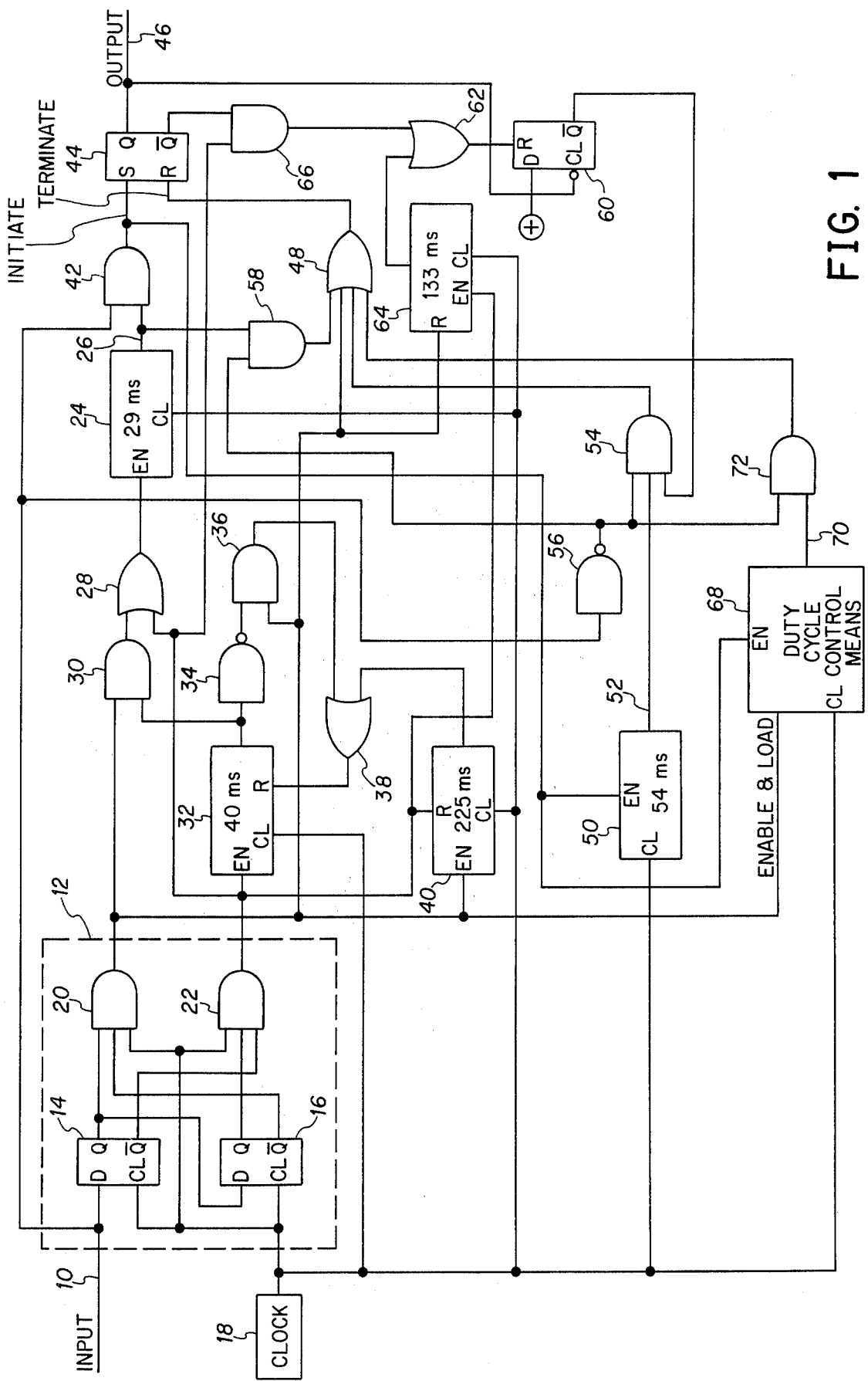
FIG. 1 is a logic diagram depicting the invention in its preferred embodiment for use in a telephone system application.
Figure 2:
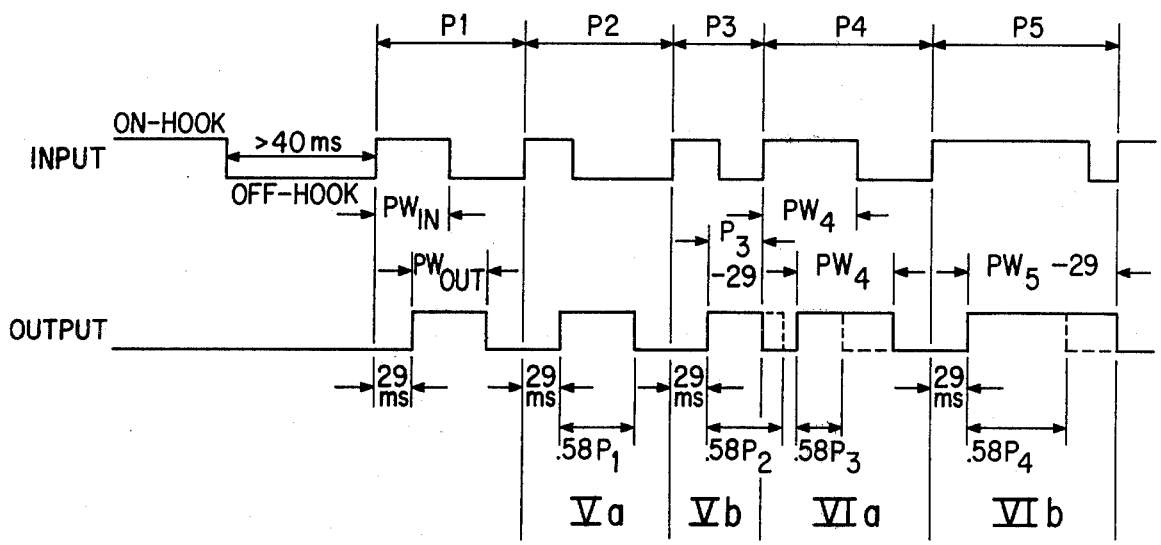
FIG. 2 presents input and resultant output pulse trains helpful to understanding the invention.

For expository purposes only, the invention will be presented in connection with a telephone application where as shown in FIG. 1, an individual input pulse train, such as depicted in FIG. 2, which represents the first digit for a called number is received on an input lead 10. The input pulse train is applied to an edge detector 12 via the D input of a first D-type flip-flop 14 whose Q output is connected to the D input of a second D-type flip-flop 16 with both flip-flops being clocked via their clock (CL) input leads from a high frequency (vis-a-vis pulse rate) clock source 18. The output of clock source 18 is applied together with the Q and $\overline{Q}$ outputs of flip-flops 14 and 16, respectively, as inputs to an AND gate 20 whose output will be seen to produce a pulse (having a duration equal to the period of one pulse for the clock signal output of clock 18) upon each positive transition (change from a low level to a high level signal condition on lead 10) corresponding to the leading edge of a pulse in the input pulse train (a pulse constituting a short positive excursion). Similarly, another AND gate 22 having its three inputs connected to receive the output of clock 18 and the $\bar{Q}$ and Q outputs of flip-flops 14 and 16, respectively, produces a pulse at its output upon the occurrence of a negative transition corresponding to the trailing edge of a pulse in the input pulse train.

The leading edge indication output of AND gate 20 is applied to a digital counter 24 to enable it to count through a period of 29 milliseconds (ms) after which it produces a pulse at its output 26 to indicate the completion of the 29 ms counting period and to initiate a pulse in the output pulse train. As will be seen hereinafter this ensures that no output pulse is generated in response to an input pulse having a width less than 29 ms, the miminum width accepted within telephone standards for a valid input pulse. The output of AND gate 20 is applied to counter 24 through one input of both an OR gate 28 in series with an AND gate 30. A second input to AND gate 30 is derived from the output of a 40 ms digital counter 32 whose count enable input (EN) is connected to the output of AND gate 22. Counter 32 serves to distinguish between on-hook and off-hook conditions for a telephone communication link, these being represented, respectively, by continuous high and low level signal conditions on lead 10. Telephone system requirements dictate that a continuous 40 ms low level signal period condition exist, defining an off-hook condition, before any dial pulses are accepted. Thus, the low-level signal output of counter 32 inhibits AND gate 30 from passing any pulses to enable the counter 24 to initiate the output train pulses until the passage of 40 ms following the first negative transition on lead 10. Thereafter, a high level signal output partially enables AND gate 30. To distinguish between the negative transitions corresponding to an off-hook condition and the trailing edges of the input dial pulses, a latch circuit is provided to render the counter 32 insensitive to subsequent negative transitions following a valid off-hook condition until an on-hook conditions ensues. This circuit comprises an inverter 34 which interconnects the output of counter 32 with an input of an AND gate 36 having a second input connected to the output of AND gate 20 and its output connected as an input to an OR gate 38. The output of OR gate 38 is connected to the reset (R) input of counter 32 to set it to its initial count preparatory to a counting cycle in response to a pulse at the output of AND gate 22 whenever the output of OR gate 38 produces a pulse. Thus, so long as counter 32 does not reach a full 40 ms count so as to produce a continuous high level signal at its output which upon inversion through gate 34 inhibits AND gate 36, any positive transition on lead 10 will produce a pulse at the output of AND gate 20 which will pass through AND gate 36 to reset counter 32. Once a 40 ms count is achieved, however, pulses will no longer be able to pass through gate 36. Counter 32 is also reset by the output from a 225 ms digital counter 40 via a second input to OR gate 38 any time that it traverses a full count beginning with a positive transition. The transition of the signal on lead 10 to a continuous high level for more than 225 ms is construed as an on-hook condition as promulgated by telephone specifications. Counter 40 is reset to its intial state by the pulse output of AND gate 22 upon each negative transition on lead 10.

The output 26 of counter 24 is connected as an input to an AND gate 42 having a second input connected to lead 10 and an output connected to the set (S) input of an R-S flip-flop 44. The Q output of flip-flop 44 provides on output lead 46 the output pulse train having a desired duty cycle that is generated in response to the input pulse train on input lead 10. Each pulse in the output pulse train on lead 46 is initiated upon the setting of flip-flop 44 and terminated uon its resetting. It will be observed that the pulse output of counter 24 upon transpiration of a full count of 29 ms will be applied to set flip-flop 44 only so long as AND gate 42 is partially enabled by a high level input signal on lead 10. Should an input pulse terminate (negative transition) prior to 29 ms after its inception any pulse produced at the output of counter 24 will be inhibited by AND gate 42 from setting flip-flop 44. Thus, no output pulse on lead 46 can result from an input pulse having a width less than 29 ms in accordance with the telephone requirements.

Flip-flop 44 is reset and consequently output pulses terminated upon the occurrence of any one of four events via an OR gate 48 whose output is connected to the R input of flip-flop 44. These events are delineated by the table hereinbelow where PW stands for pulse width, P the cyclical period in ms between the leading edges of consecutive pulses and the subscripts of P, $c$ and $p$ for current and preceding, respectively. It must be borne in mind that the subject invention contemplates no storage of information so that each output pulse must be generated in the same time frame as that for its counterpart input pulse so that all input pulses are dynamically accounted for in real time and no overlapping of time frames occurs. Each cyclical period for the input pulse train on lead 10 is used to determine the appropriate pulse width for the output pulse corresponding to the next successive input cyclical period in order to achieve a desired duty cycle, herein 58%. Since output pulses are being generated on a dynamic basis, the first output pulse is treated differently from all subsequent pulses since under this arrangement there can be no input cyclical period for determining its proper pulse width. As mentioned earlier, no output pulse is produced unless the input pulse has a width greater than 29 ms (the same being true for all subsequent pulses vis-a-vis their counterpart input pulses as well as the first).

|  |  | FIRST PULSE | | |
| --- | --- | --- | --- | --- |
|  |  | $(PW)_{in}$ | $P_1(ms)$ | $PW_{out}$ |
| I. |  | <29 | — | 0 |
| II. | (a) | 29–54 | >83 | .54 |
|  | (b) |  | <83 | $P_1-29$ |
| III. | (a) | >54 | $>29 + PW_{in}$ | $PW_{in}$ |
|  | (b) |  | $<29 + PW_{in}$ | $P_1-29$ |
|  |  | SUBSEQUENT PULSES | | |
|  |  | $(PW)_{in}$ | $P_c(ms)$ | $PW_{out}$ |
| IV. |  | <29 | — | 0 |
| V. | (a) | >29, but <29 + .58$P_p$ | $>29 + PW_{in}$ | .58$P_p$ |
|  | (b) |  | $<29 + PW_{in}$ | $P_c-29$ |
| IV. | (a) | $>29 + .58P_p$ | $>29 + PW_{in}$ | $PW_{in}$ |
|  | (b) |  | $<29 + PW_{in}$ | $P_c-29$ |

Based on the highest anticipated telephone system pulse rate of 12 pulses per second the minimum anticipated input cyclical period is 83 ms. Taking into account the 29 ms period required to ascertain that the input pulse meets this minimum width there is thus left 54 ms in each input cyclical period to dynamically generate an output pulse without overlapping. If the PW for the first input pulse lies in the range between 29 and 54 ms, the PW for the corresponding output pulse is made equal to 54 ms (IIa of the table hereinabove) so long as the first input cyclical period exceeds 83 ms to avoid having the first output pulse overlap into the cyclical period for the second input pulse. If the first cyclical period for the input pulse should be less than 83 ms and its PW lies between 29 to 54 ms IIb), then the first output pulse is foreshortened to a PW of $P_1 - 29$ so that it terminates coincident with the termination of the first input cyclical period. This foreshortened termination is an overriding control feature common to the generation of all output pulses, both first and subsequent, irrespective of the PW for the input pulses.

When the trailing edge of an input pulse upon its termination occurs prior in time to the trailing edge for its counterpart output pulse, the output pulse can be immediately terminated since it is known to be based on a valid input pulse, its negative transition being indicative thereof. However, should the trailing edge of an output pulse occur prior in time to the trailing edge of its counterpart input pulse, there is no way at that point to determine whether there is in fact an input pulse whose PW is unusually wide or some other condition such as on-hook. In this case, the output pulse is extended so that it terminates only after the termination of the input pulse (by 29 ms) and thus has a PW equal to that of the input pulse (IIIa) so as to avoid generating any spurious output pulses, so long as the first input cyclical period permits. If it does not, as already mentioned, the output pulse is foreshortened to $P_1 - 29$.

The foregoing is implemented through the use of a 54 ms digital counter 50 which is enabled to initiate a counting cycle of the clock pulses produced by clock 18 in response to the pulse produced at the output of AND gate 42 upon the transpiration of 29 ms following each positive transition in the input pulse train as measured by counter 24. Upon the transpiration of 54 ms, counter 56 produces a pulse at its output 52 which is applied as an input to an AND gate 54 whose output is connected as an input to OR gate 48. If at this time, the first input pulse has ended, the low level signal applied as a second input to AND gate 54 via an inverter 56 will enable the pulse on output 52 to pass (assuming that a third input of AND gate 54 is high as will be explained shortly) so as to reset flip-flop 44 via OR gate 48, thus terminating the output pulse. If the input pulse has not yet terminated at this time, the output 52 of counter 50 has no effect since lead 10 will be at a high level state, thus disabling AND gate 54 via inverter 56. This arrangement implements condition IIa of the above table.

Condition IIIa wherein the input pulse is still present upon the expiration of the 54 ms count for counter 50 is implemented through an AND gate 58 having one input connected to the output 26 of counter 24 and another input connected to the output of inverter 56 and its output connected as an input to OR gate 48 in addition to the connection of the output of AND gate 22 as a second input to OR gate 28. This second input to OR gate 28 causes a counter 24 to initiate a 29 ms counting cycle to response to all negative transitions for the input pulse train. Thus, the output 26 of counter 24, together with the low level input to inverter 56 (the input pulse train having a low level state since the input pulse has terminated and assuming an extant first input cyclical period) causes the resetting flip-flop 44 via OR gate 48 29 ms after the termination of the first input pulse. Since the leading and trailing edges of the first output pulse are displaced from their counterparts of the first input pulse by the same amount, namely, 29 milliseconds, its pulse width must be exactly the same as that of the input pulse.

A third input to OR gate 48 taken directly from the output of AND gate 20 causes the reset of flip-flop 44 any time that there is a positive transition in the input pulse train, thus foreshortening the output pulse as alluded to earlier so as to avoid any overlapping time frames. This implements conditions IIb and IIIb.

The counter 50 is used solely to generate the first output pulse so that once this has occurred, it is disabled from having any further effect by disabling AND gate 54 via the aforementioned third input thereto. This is accomplished with the use of a D-type flip-flop 60 whose $\overline{Q}$ output is connected as the third input to AND gate 54, whose D input is connected to a high level logic signal source and whose CL input is connected to output lead 46. Flip-flop 60 responds to negative transitions at its CL input so that whenever flip-flop 44 is reset to terminate the first output pulse, the $\overline{Q}$ ouptut of flip-flop 60 assumes a low level state so as to inhibit AND gate 54. Prior thereto, flip-flop 60 will have been in the reset state so that its high $\overline{Q}$ output will have permitted the first pulse output 52 of counter 50 to pass through AND gate 54 to reset flipflop 44. Flip-flop 60 is reset by the output of an OR gate 62 having one input connected to a 133 ms digital counter 64 and a second input connected to the output of an AND gate 66 having one input connected to the $\overline{Q}$ output of flip-flop 44 and a second input connected directly to the output of AND gate 22. Counter 64 is enabled to begin a count with each negative transition in the input signal while it is reset in response to each positive transition. Since consecutive pulse trains denoting consecutive telephone number digits are normlly separated by a minimum period which is in excess of 125 ms, the absence of a pulse for more than that period of time signifies that the next received pulse is the first one in a new pulse train rather than part of a subsisting pulse train. This then, requires the operation of counter 50 again for generating the first counterpart output pulse. Thus, flip-flop 60 is reset after the passage of any desired inactive period in excess of 125 ms, 133 ms having been chosen, following a pulse to indicate that the associated pulse train has ended and that another oen is about to begin. Flip-flop 60 is also reset to activate counter 50 any time that the PW for an input pulse is less than 29 ms since its cyclical period may not be considered reliable for determining the duty cycle as is done for all pulses after the first (to be explained shortly). Thus, the termination of an input pulse before 29 ms has transpired from its inception will result in the pulse at the output of AND gate 22, indicating a negative transition, to pass through AND gate 66 since flip-flop 44 will be in the reset state at that time, not having been set in response to the output 26 of counter 24.

Figure 3:
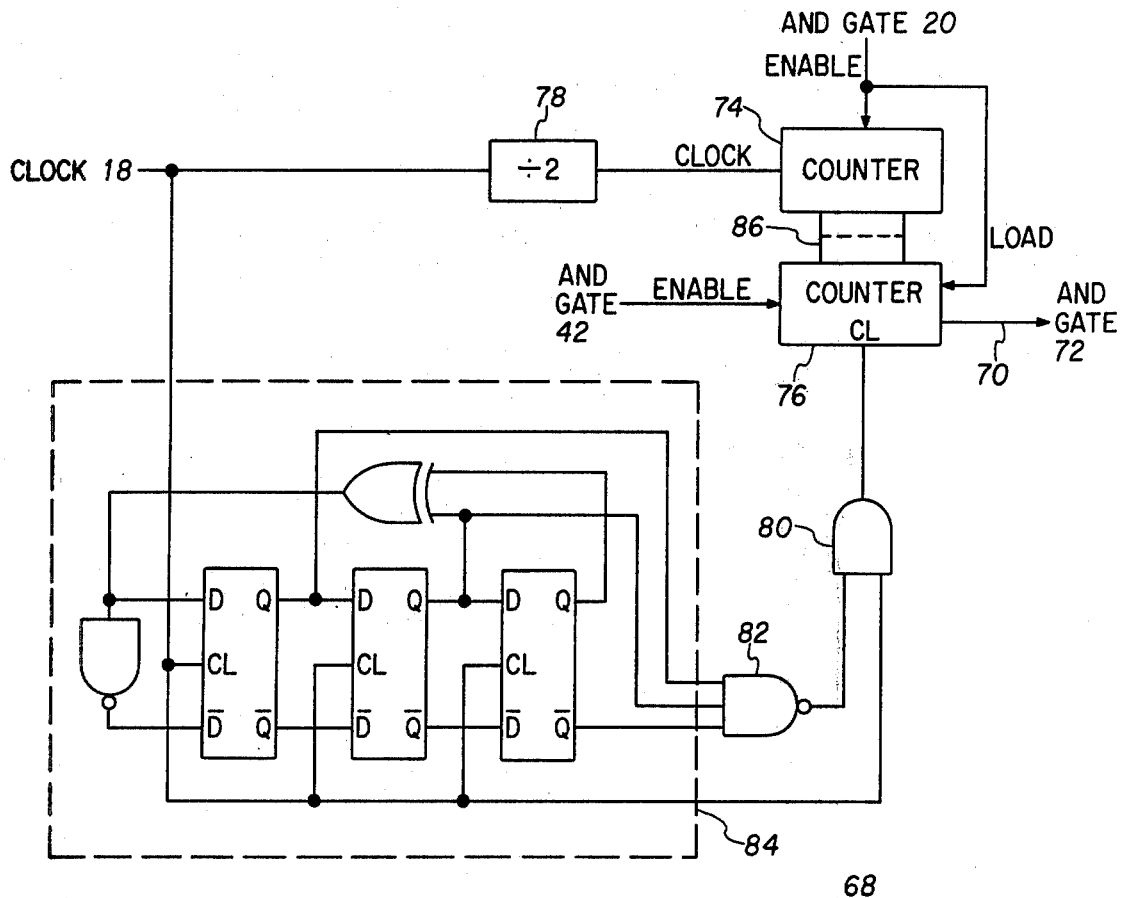
FIG. 3 pictorially depicts in detail the preferred duty cycle control means of FIG. 1.

All output pulses subsequent to the first one are generated through the use of a duty cycle control means 68 which is detailed in FIG. 3 and will be so described shortly. Duty cycle control means 68 provides a digital count of the clock pulses from clock source 18 to afford a digital counting interval indicative of each input cyclical period when enabled in response to the pulse output of AND gate 20 at the beginning of each cyclical period upon a positive transition on lead 10. At the termination of each input cyclical period conicident with the leading edge of the next successive input cyclical period, the digital count achieved which is indicative of the time for that cyclical period is loaded into another counter to permit the digital counting interval to be traversed in response to the initiate signal from the output of AND gate 42 at a frequency such that the counting interval is completed in a predetermined percentage of the cyclical period time measured, equal to the desired duty cycle. In the instant case, this would be 58%. On completion of this count, duty cycle control means 68 produces a pulse at its output 70 which is enabled to pass through an AND gate 72 to reset flip-flop 44 via OR gate 48 if the input signal applied to inverter 56 is low so that its output which is applied to AND gate 72 is high. All conditions previously discussed in conjunction with the first output pulse apply equally to all the subsequent pulses under the control of the duty cycle control means 68, it being understood that the PW for each output pulse is being compared with the PW for each input pulse whose cyclical period it falls into, as denoted by subscript c, while the duty cycle applied to that output pulse is formulated on the basis of the cyclical period of the preceding input pulse as denoted by the subscript p. These conditions are all pictorially depicted in FIG. 2. Thus, if an input pulse is less than 29 ms in duration, no output pulse is produced (condition IV of the foregoing table). If a subsequent valid input pulse has a PW less than $29 + 0.58P_p$, the output pulse corresponding thereto will have a PW of $0.58P_p$ if the current input cyclical period $P_c$ corresponding thereto permits ($0.58P_1$ for Va), or $P_c - 29$ if it does not ($P_3 - 29$ for Vb). If a valid input pulse has a PW greater than $29 + 0.58P_p$, then the resulting output pulse will have a Pw equal to that of the subsequent input pulse if the input cyclical period $P_c$ corresponding thereto permits ($PW_4$ for VIa) or $P_c - 29$ ($PW_5 - 29$ for VIb) if it does not. Thus, the same constraints are seen to pertain to both first and all subsequent pulses.

As shown in FIG. 3, the duty cycle control means 68 comprises two counters, 74 and 76, the first for providing a digital count during each input cyclical period so as to afford a digital counting interval indicative thereof and the second for traversing the count in the requisite predetermined percentage time for effectuating the desired duty cycle. The clock pulses produced by clock 18 are applied to counter 74 through a divide by two circuit 78 while they are applied to counter 76 directly via one input of an AND gate 80 having a second input connected to a NAND gate 82. NAND gate 82 has three inputs, each being connected to a different stage of a three-stage maxi-length counter 84 which provides a full count of seven before recycling in response to the clock pulses of clock 18 which are applied thereto. The operation of maxi-length counters is well documented in the literature such as at page 298 of a text entitled, "Designing with TTL Integrated Circuits" so that it need not be described in detail herein. It will be readily seen that all clock pulses applied to the first input of AND gate 80 will be permitted to pass therethrough to clock counter 76 with the exception of one out of every seven consecutive pulses corresponding to the particular decoded state of maxi-length counter 84 (first two stage Q outputs and the last stage $\bar{Q}$ output all high as represented in FIG. 3) which causes the output of NAND gate 82 at that time to be low so as to partially disable AND gate 80. Thus, for every seven consecutive pulses produced by clock 18 only six will be applied to counter 76. This combined with operating counter 74 at a clock frequency which is one-half that for counter 76 results in counter 76 traversing a digital counting interval in only 58% of the time required by counter 74. Thus, by having counter 74 count from a fixed point, for example in one direction such as up, to provide a give digital count, and counter 76 count in the opposite direction such as down, from the programmed digital count loaded thereinto to the fixed point, the time taken for counter 76 to traverse the count affords a time measurement which is exactly 58% of the time required by counter 74 to traverse the same count. The pulse at the output of AND gate 20 triggered by the leading edge of each input cyclical period enables counter 74 to initiate its count while the digital count achieved in the preceding cyclical period is loaded into counter 76 via parallel leads 86. Counter 76 is enabled to initiate its count beginning at the programmed digital count level loaded thereinto in response to the initiate signal at the outut of AND gate 42 following the transpiration of 29 ms from the beginning of each input pulse. When counter 76 has completed traversing its count from the programmed level its produces a pulse at its output 70 which so signifies.

As the foregoing demonstrates, the invention herein affords a totally digitalized technique for dynamically generating an output pulse train having desired duty cycle in response to an input pulse train. Although presented for use in a telephone system, it is to be understood that the subject invention has broader applications. Since it is quite conceivable to modify the detailed description herein without departing from the scope and spirit of the invention, the foregoing is to be considered exemplary and not circumscriptive of the invention as it will now be claimed hereinbelow.

What is claimed is:

1. Digital apparatus for dynamically generating an output pulse train in response to an input pulse train, comprising:

inititate circuit means for receiving the input pulse train and providing an initiate signal upon the transpiration of a predetermined period of time following the inception of each input pulse;

pulse generator means connected to said initiate circuit means for providing the output pulse train, each pulse thereof being initiated in response to an initiate signal and being terminated in response to a terminate signal;

duty cycle control means for receiving the input pulse train and connected to said initiate circuit means for digitally measuring each input cyclical period beginning with the leading edge of an input pulse to provide a digital counting interval indicative thereof and during the next successive input cyclical period traversing said digital counting interval in a time corresponding to a predetermined percentage of the measured cyclical period in response to said initiate signal, and terminate circuit means for receiving the input pulse train and connected to said duty cycle control means for generating said terminate signal upon the earlier completion of said digital counting interval traversal or the input cyclical period during which it begins.

2. The apparatus of claim 1 including means for rendering said terminate circuit means responsive to the transpiration of said predetermined period of time following the termination of an input pulse in lieu of said digital counting interval traversed whenever said traversal is completed during the presence of an input pulse.

3. The apparatus of claim 2 wherein said duty cycle control means comprises a first counter for providing a digital count indicative of each input cyclical period and a second counter connected thereto for receiving said digital count prior to traversing said digital counting interval.

4. The apparatus of claim 3 wherein said predetermined percentage has a value of 58% and said duty cycle control means includes a source of clock pulses for driving both of said counters, means connected thereto for driving said second counter at a frequency twice that of said first counter and means also connected thereto for omitting every seventh clock pulse from being applied to said second counter.

5. The apparatus of claim 4 wherein said seventh clock pulse omitting means comprises a 3-state maxi-length counter and decoding means connected thereto for identifying one of its seven unique states to inhibit the application of the seventh clock to said second counter at that time.

6. The apparatus of claim 2 wherein said terminate circuit means includes means for generating said terminate signal upon the earlier completion of the first input cyclical period or the transpiration of a fixed period of time following the initiation of the first output pulse.

7. The apparatus of claim 6 including means connected to said initiate circuit means for rendering said terminate circuit means responsive to the transpiration of the first input pulse in lieu of said transpiration of a fixed period of time whenever said fixed period expires during the presence of the first input pulse.

8. Digital apparatus for affording a 58% duty cycle from a pulse train comprising:
    a source of clock pulses;
    a divide by two circuit connected to said source;
    a first counter connected to said divide by two circuit for providing a digital count of said clock pulses received via said divide by two circuit corresponding to a digital counting interval during each cyclical period of the pulse train;
    a second counter;
    means connected to said first counter for loading the digital count achieved at the end of each counting interval into said second counter;
    a 3-state maxi-length counter operated from said clock pulses;
    decoding means connected to said maxi-length counter for identifying one of the seven unique states of said maxi-length counter and generating an inhibit signal in response thereto, and
    grating means connected to said decoding means for passing said clock pulses to said second counter in the absence of said inhibit signal to permit said second count to traverse said digital counting interval.

9. A digital method for dynamically generating an output pulse train in response to an input pulse train, comprising:
    generating an initiate signal upon the transpiration of a predetermined period of time following the inception of each input pulse;
    initiating an output pulse in resonse to said initiate signal and terminating it in response to a terminate signal;
    digitally measuring each input cyclical period beginning with the leading edge of an input pulse to provide a digital counting interval indicative thereof and during the next successive input cyclical period traversing said digital counting interval in a time corresponding to a predetermined percentage of the measured, cyclical period in response to said inititate signal, and
    generating said terminate signal upon the earlier completion of said digital counting interval or the input cyclical period during which it begins.

10. The method of claim 9 including generating said terminate signal in response to the transpiration of said predetermined period of time following the termination of an input pulse in lieu of said digital counting interval traversal whenever said traversal is completed during the presence of an input pulse.

* * * * *

UNITED STATES PATENT AND TRADEMARK OFFICE
CERTIFICATE OF CORRECTION

PATENT NO. : 4,075,569
DATED : February 21, 1978
INVENTOR(S) : Howard O. Wright

It is certified that error appears in the above-identified patent and that said Letters Patent are hereby corrected as shown below:

Column 2, line 43, insert --before-- before "being".
Column 3, line 46, delete "conditions" and insert therefor --condition--.
Column 5, line 11, delete "to" and substitute therefor --and--; line 42, delete "56" and insert --50--; line 51, after "output" insert --of--. line 63, after "causes" delete "a".
Column 6, line 24, after "$\overline{Q}$", delete "ouptut" and insert therefor --output--; line 29, after "reset", delete "flipflop" and insert therefor --flip-flop--; line 39, delete "normlly", and insert therefor --normally--; line 49, delete "oen" and insert --one--.
Column 7, line 12, before "duty" insert --the--; line 35, delete "Pw" and insert --PW--.
Column 8, line 7, delete "give" and insert --given--; line 20, delete "outut" and insert --output--.
IN THE CLAIMS
Column 9,
(claim 7) line 35, before "the first" insert --said predetermined period of time following the termination of--.

Column 10, (claim 9) line 24, delete "resonse" and insert --response--; line 33, after "measured" delete ",".

Signed and Sealed this

Twenty-sixth Day of September 1978

[SEAL]

Attest:

RUTH C. MASON
Attesting Officer

DONALD W. BANNER
Commissioner of Patents and Trademarks